(12) United States Patent
Delano

(10) Patent No.: US 6,628,166 B2
(45) Date of Patent: Sep. 30, 2003

(54) RF COMMUNICATION SYSTEM USING AN RF DIGITAL AMPLIFIER

(75) Inventor: Carry L. Delano, Los Altos, CA (US)

(73) Assignee: Tripath Technology, Inc., San Jose, CA (US)

( * ) Notice: Subject to any disclaimer, the term of this patent is extended or adjusted under 35 U.S.C. 154(b) by 0 days.

(21) Appl. No.: 09/796,735

(22) Filed: Feb. 28, 2001

(65) Prior Publication Data

US 2001/0028272 A1 Oct. 11, 2001

Related U.S. Application Data

(60) Provisional application No. 60/186,844, filed on Mar. 3, 2000.

(51) Int. Cl.$^7$ .............................................. H03F 3/217
(52) U.S. Cl. .................... 330/251; 330/207 A; 330/292
(58) Field of Search .............................. 330/10, 207 A, 330/251, 292

(56) References Cited

U.S. PATENT DOCUMENTS

| | | | | |
|---|---|---|---|---|
| 4,326,170 A | * | 4/1982 | Levy | 330/10 |
| 4,673,889 A | * | 6/1987 | Cini et al. | 330/10 |
| 4,949,048 A | * | 8/1990 | Tokumo et al. | 330/10 |
| 5,023,566 A | | 6/1991 | El-Hamamsy et al. | 330/251 |
| 5,479,337 A | * | 12/1995 | Voigt | 363/131 |
| 5,777,512 A | * | 7/1998 | Tripathi et al. | 330/207 A |
| 6,246,283 B1 | * | 6/2001 | Ahuja et al. | 330/109 |
| 6,316,992 B1 | * | 11/2001 | Miao et al. | 330/2 |
| 6,362,683 B1 | * | 3/2002 | Miao et al. | 330/10 |

OTHER PUBLICATIONS

Karsten Nielson, "High–Fidelity PW M–Based Amplifier Concept for Active Loudspeaker Systems with Very Low Energy Consumption", J. Audio Eng. Soc., vol. 45 No. 7/8, Jul./Aug. 1997, pp. 555–570.

* cited by examiner

Primary Examiner—Henry Choe
(74) Attorney, Agent, or Firm—Beyer Weaver & Thomas, LLP.

(57) ABSTRACT

Band pass amplifiers and methods for driving the same are described. According to one embodiment, a frequency selective network is provided in a feedback loop. An analog-to-digital converter is coupled to the frequency selective network. A switching stage is coupled to the analog-to-digital converter for producing a continuous-time output signal. The switching stage includes at least one resonance circuit configured to resonate at a resonance frequency and thereby generate at least a portion of the continuous-time output signal. A continuous-time feedback path continuously senses and feeds back the continuous-time output signal to the frequency selective network.

26 Claims, 7 Drawing Sheets

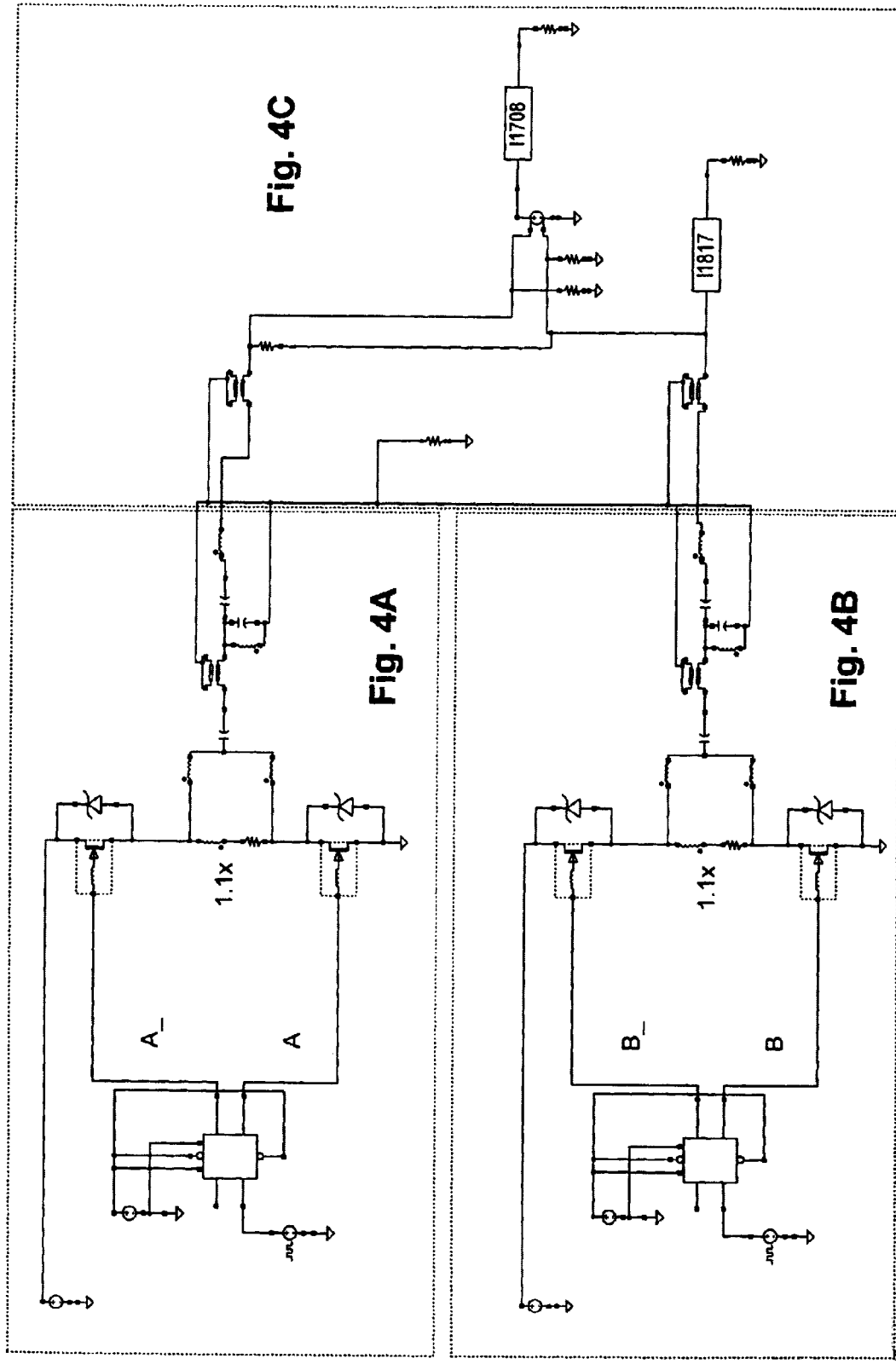

RF COMMUNICATION SYSTEM USING AN RF DIGITAL AMPLIFIER

RELATED APPLICATION DATA

The present application claims priority from U.S. Provisional Patent Application No. 60/186,844 for RF COMMUNICATION SYSTEM USING AN RF DIGITAL AMPLIFIER filed on Mar. 3, 2000, the entire disclosure of which is incorporated herein by reference for all purposes.

BACKGROUND OF THE INVENTION

The present invention relates to radio frequency (RF) communication systems, and more specifically, to apparatus and methods for rejecting receive band signals in RF mixed-signal amplifiers.

Wireless communication, such as cell phones for voice and data, has become extremely popular. Currently, several wireless schemes are in use, including GSM, TDMA, and CDMA. Of these, CDMA appears to be emerging as the standard in the U.S., European and Asian markets. CDMA often requires RF transmissions using both phase and amplitude modulation. The efficiency and power consumption of the power linear amplifiers used to generate an RF signal in either a CDMA cell phone or base station are therefore extremely important. Use of low efficiency linear amplifiers is detrimental for several reasons.

Such amplifiers tend to burn a significant amount of energy which is problematic, particularly in a battery operated cell phone. Power consumption is also problematic in base stations. The heat caused by many low efficiency amplifiers in a base station can cause components to fail, thus reducing reliability. The linearity of the power amplifier is also important. In a base stations where the transmission of multiple signals occurs simultaneously, amplifiers characterized by poor linearity may cause the inadvertent mixing of these signals.

A number of types of amplifier classes can be used in RF communication systems, including Class A, Class AB, Class C, Class E, Class F, and Class D (sometimes referred to as digital amplifiers). Each of these types of amplifiers, however, have significant problems when operating in the RF range. For example, Class A and Class AB amplifiers have very poor efficiency. Classes C, E, F and D amplifiers have improved power efficiency when compared to Class A and Class AB type amplifiers, but they are not suitable for linear applications. Further, Class E amplifiers suffer from severe overshoot problems at their output hence limiting their usefulness. Class F amplifiers exhibit relatively good output switching characteristics with a repeating input signal. But with a non-repeating input signal, such as those normally encountered in a cellular phone or base station, the problems caused by harmonics become overwhelming. As a result, Class F amplifiers are difficult to use in RF linear power amplifier applications.

Conventional class D amplifiers have linear operating characteristics and are generally highly efficient at lower frequencies but have heretofore been subject to several drawbacks at higher frequencies. Most notably, at higher frequencies such as RF they exhibit switching problems at their output transistors. As these transistors switch on and off rapidly, switching transients including high levels of current and voltage are developed at the output, causing overshoot and undershoot.

In view of the foregoing, it is desirable to provide an efficient digital amplifier capable of operating in the RF range.

SUMMARY OF THE INVENTION

According to the present invention a band pass amplifier is provided having a frequency selective network in a feedback loop. An analog-to-digital converter is coupled to the frequency selective network. A switching stage is coupled to the analog-to-digital converter for producing a continuous-time output signal. The switching stage includes at least one resonance circuit configured to resonate at a resonance frequency and thereby generate at least a portion of the continuous-time output signal. A continuous-time feedback path continuously senses and feeds back the continuous-time output signal to the frequency selective network.

A switching stage for a band pass amplifier is also provided. The switching stage includes first and second switches in a half-bridge configuration, each of the first and second switches having parasitic capacitances associated therewith. The switching stage further comprises a plurality of inductors. Two resonance circuits are formed from the parasitic capacitances and the inductors, the two resonance circuits being configured to alternately resonate at a resonance frequency.

A further understanding of the nature and advantages of the present invention may be realized by reference to the remaining portions of the specification and the drawings.

DETAILED DESCRIPTION OF SPECIFIC EMBODIMENTS

Figure 1:
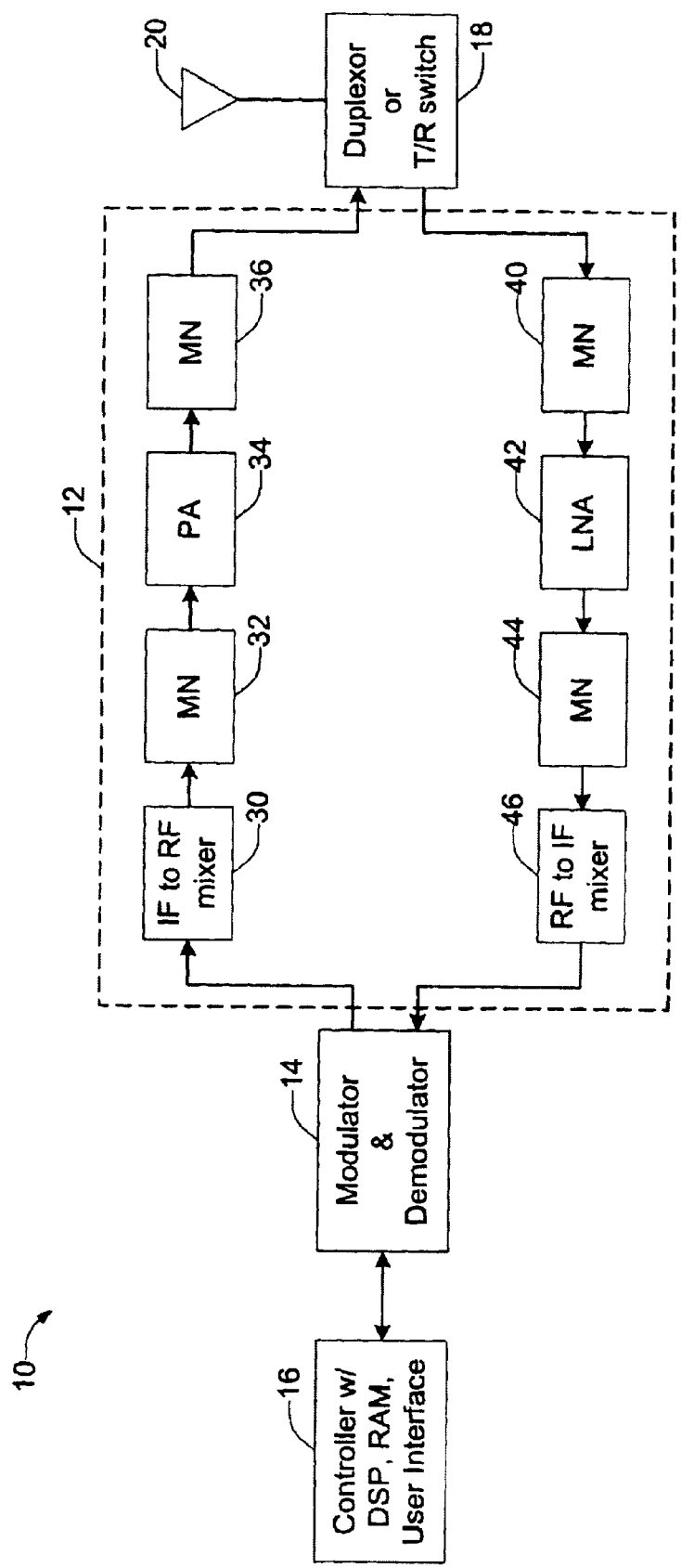
FIG. 1 is a block diagram of a cellular phone designed according to a specific embodiment of the present invention.

Referring to FIG. 1, a simplified block diagram of a cell phone 10 designed according to the present invention is shown. Cell phone 10 includes an RF block 12, a modulation and demodulation block 14, a controller block 16 including DSP, RAM, user interface, base band circuitry configured to generate a base band signal, and other standard circuitry used in a cell phone, a duplexor or a T/R switch 18 (a duplexor switch is used for cell phones that transmit and receive at the same time, a T/R switch is used for cell phones that transmit and receive alternately), and antenna 20. During transmission the base band circuitry in controller 16 is responsible for generating a base band signal, which is typically a string of bits representative of the information to be transmitted. The base band signal is then modulated in box 14 with an intermediate frequency (IF) modulation signal which is then provided to RF block 12. Since the functionality of the modulation and demodulation block 14, controller 16, duplexor/T/R switch 18 and antenna 20 are all well known in the art, a detailed description of each is not provided herein.

RF block 12 includes an IF to RF mixer 30 for generating an RF signal (e.g., 900 MHz) from the modulated signal received from controller 16 through modulator 14, a matching network (MN) 32, a power amplifier (PA) 34 configured to amplify the RF signal, and another matching network (MN) 36. During transmission, amplifier 34 amplifies the RF signal and provides it to antenna 20 via matching network 36 and duplexor/T/R switch 18. On the receive side, RF block 12 includes a matching network 40 configured to receive an RF signal (e.g., 980 MHz) received by antenna 20, an LNA Amplifier 42, another matching network 44, an RF to IF mixer 46 which mixes down the RF signal to the IF range and then provides it to the demodulator in block 14. Demodulator 14 demodulates the transmitted base band information and provides it to controller 16. Since mixer circuits 30 and 46, LNA 42, and matching networks 32, 40 and 44 are all well known, they are not described in detail herein.

Figure 2:
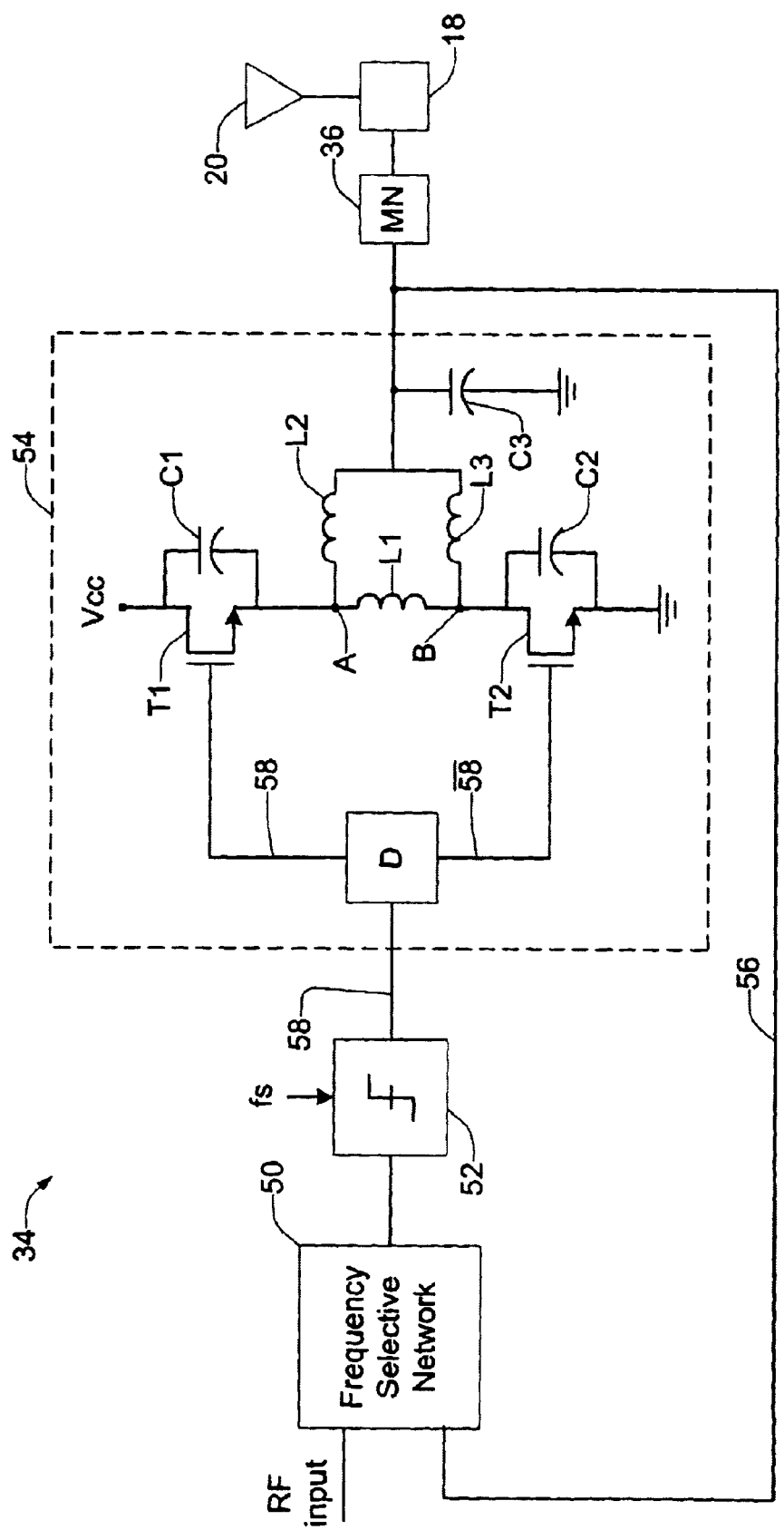
FIG. 2 is a circuit diagram of a digital RF power amplifier designed according to a specific embodiment of the present invention.

Referring to FIG. 2, a schematic diagram of a digital RF power amplifier 34 designed according to a specific embodiment of the present invention is shown. According to various specific embodiments, amplifier 34 may be designed in accordance with the techniques described in U.S. Pat. No. 5,777,512 for METHOD AND APPARATUS FOR OVERSAMPLED, NOISE-SHAPING, MIXED-SIGNAL PROCESSING issued on Jul. 7, 1998, the entire disclosure of which is incorporated herein by reference for all purposes. Amplifier 34 includes a frequency selective network 50 with a high Q at the desired transmission frequency, an analog-to-digital converter (A/D) 52, an output stage 54, and a feedback loop 56 which provides a continuous-time feedback signal from output stage 54 to frequency selective network 50. A/D converter 52 samples the output of frequency selective network 50 and generates a digital signal at 58 which is provided to output stage 54. In one embodiment, A/D converter 52 is a comparator that samples at a frequency (fs) of 3.6 GHz for applications where a transmission frequency of 900 MHz is desired. In alternate embodiments, the sampling frequency (fs) can range from a minimum of 1.8 GHz to 3.6 GHz or higher for the transmission of a 900 MHz signal. According to one such alternate embodiment, A/D converter 52 is an unclocked comparator (i.e., fs→∞) in series with a delay line, operating essentially as a Schmitt trigger. In general, the sampling frequency (fs) is preferably at least 2× the desired transmission frequency.

One possible implementation of an output stage 54 includes two transistors T1 and T2, inductors L1, L2, and L3, capacitors C1, C2 and C3, and a pre-driver D. The pre-driver D is configured to buffer signal 58 and to provide signal 58 and its complement to the gates of transistor Ti and transistor T2 respectively. The drain of T1 is coupled to Vcc and the source is coupled to node A. Capacitor C1 is typically the parasitic capacitor between the source and drain of transistor T1. The drain of T2 is coupled to node B and the source is coupled to ground. Capacitor C2 is typically the parasitic capacitor between the source and drain of transistor T2. Inductor L1 is coupled between node A and node B, and inductors L2 and L3 are coupled between capacitor C3 and nodes A and B, respectively.

During operation, digital signal 58 generated by A/D converter 52 transitions between high and low in accordance with the information being transmitted. Since signal 58 and its complement are provided to the gates of transistors T1 and T2 respectively, one transistor is always on and the other is off depending on the state of signal 58. When signal 58 transitions low for example, Ti turns off and T2 turns on. When this occurs node A resonates due to the formation of a resonating circuit within output stage 54. This resonating circuit is formed by C1, the three inductors L1, L2, and L3, and node B which is pulled to ground through T2. Driver circuit 54 thus in effect contains two separate resonances at nodes A and B. Depending on the state of signal 58, one node resonates while the other is clamped. In one embodiment, the resonances are tuned to resonate at the sampling frequency of 3.6 GHz. This is accomplished by appropriate selection of the values of inductors L1, L2, and L3 and capacitors C1, C2 and C3. According to a specific embodiment, C3 is selected to pass the RF frequency.

The output of switching stage 54 is provided to matching network 36 which acts as a band pass filter operating at the transmit band. Since antenna 20 transmits at 900 MHz in the above described embodiment, the "tracking" function of matching network 36 needs to match this frequency. In one embodiment, this is accomplished by selecting the values of L1, L2, and L3, and C3 so that the resonance circuit has a transfer function looking into matching network 36 of approximately 900 MHz so that the output bit pattern generated by T1 and T2 has an energy component at 900 MHz. In other words, matching network 36 has to provide a gain sufficient to make sure that the bit pattern has sufficient energy at 900 MHz for the ohmic level of the antenna (which is typically 50 ohms).

In another embodiment, matching network 36 uses the bond wires on the chip containing power amplifier 34 and other passive components, to create a matching network to provide optimal power transfer to antenna 20 and to transform the ohmic value of the antenna to an impedance where the desired power level can be achieved from a given supply voltage. This requires a relatively high Q filter that has a relatively narrow band. In yet another embodiment, power amplifier 34 is designed to have a bridged output. In applications where antenna 20 has a single ended output, a balun (balanced to unbalanced converter) or passive LC combiners may be used.

Figure 3:
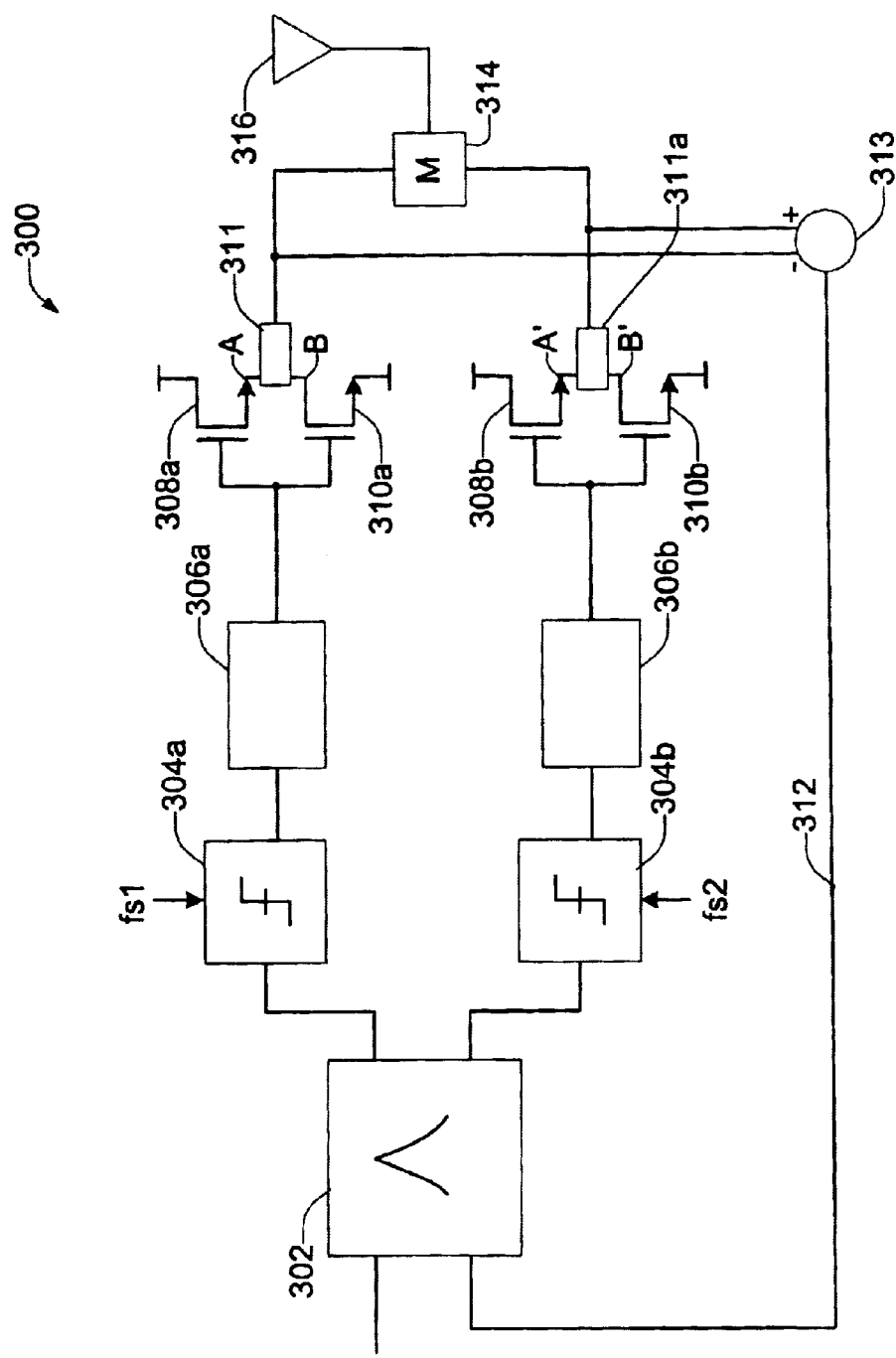
FIG. 3 is a schematic diagram of a digital RF power amplifier designed according to another embodiment of the present invention.

FIG. 3 shows another RF band pass noise-shaping amplifier 300 designed according to the present invention as well as techniques described in U.S. Pat. No. 5,777,512 incorporated herein by reference above. As will be described, RF amplifier 300 is configured to effect multi-level switching. RF amplifier 300 includes a frequency selective network 302 which, using continuous-time feedback, noise shapes the modulated RF input. According to a specific embodiment, network 302 comprises at least one resonator stage having a transfer function designed to pass a band centered around 900 MHz.

Two A/D converters 304a and 304b convert the noise shaped RF signal to digital data using independently generated clock signals at a nominal sampling frequency fs (i.e., fs1 and fs2) which, according to a specific embodiment, is 3.6 GHz. According to one embodiment, A/D converters 304a and 304b comprise two comparators configured to implement three-level switching.

Gate drive circuits 306a and 306b take the pulse trains from A/D converters 304a and 304b, respectively, and generate gate drive for their pair of transistors, i.e., FETs 308a and 310a or FETs 308b and 310b. Each pair of transistors has two separate resonances due to resonator circuits 311 and 311 a respectively. That is, the power stage comprising FETs 308a and 310a has separate resonances at nodes A and B, while the stage comprising FETs 308b and 310b has separate resonances at nodes A' and B'. According to a specific embodiment, each of resonator circuits 311 and 311 a are configured similarly to the resonance circuit in switching stage 54 of FIG. 2, i.e., the circuit formed by L1, L2, and L3, and C3.

Continuous-time feedback is provided to frequency selective network 302 via feedback path 312 and adder 313. The output signals of the power stages are passed to a matching network 314 which passes the output RF signal to antenna 316 for transmission.

Having two comparators for A/D converters 304a and 304b allows the digital data to have three quantization states, i.e., three-level switching, rather than two. With the two quantization states of, for example, amplifier 34, there may be a high number of signal transitions resulting in high drive losses. By contrast, with three states a "0" state can be selected when there is no signal output to avoid such undesirable switching losses.

Figure 4A:
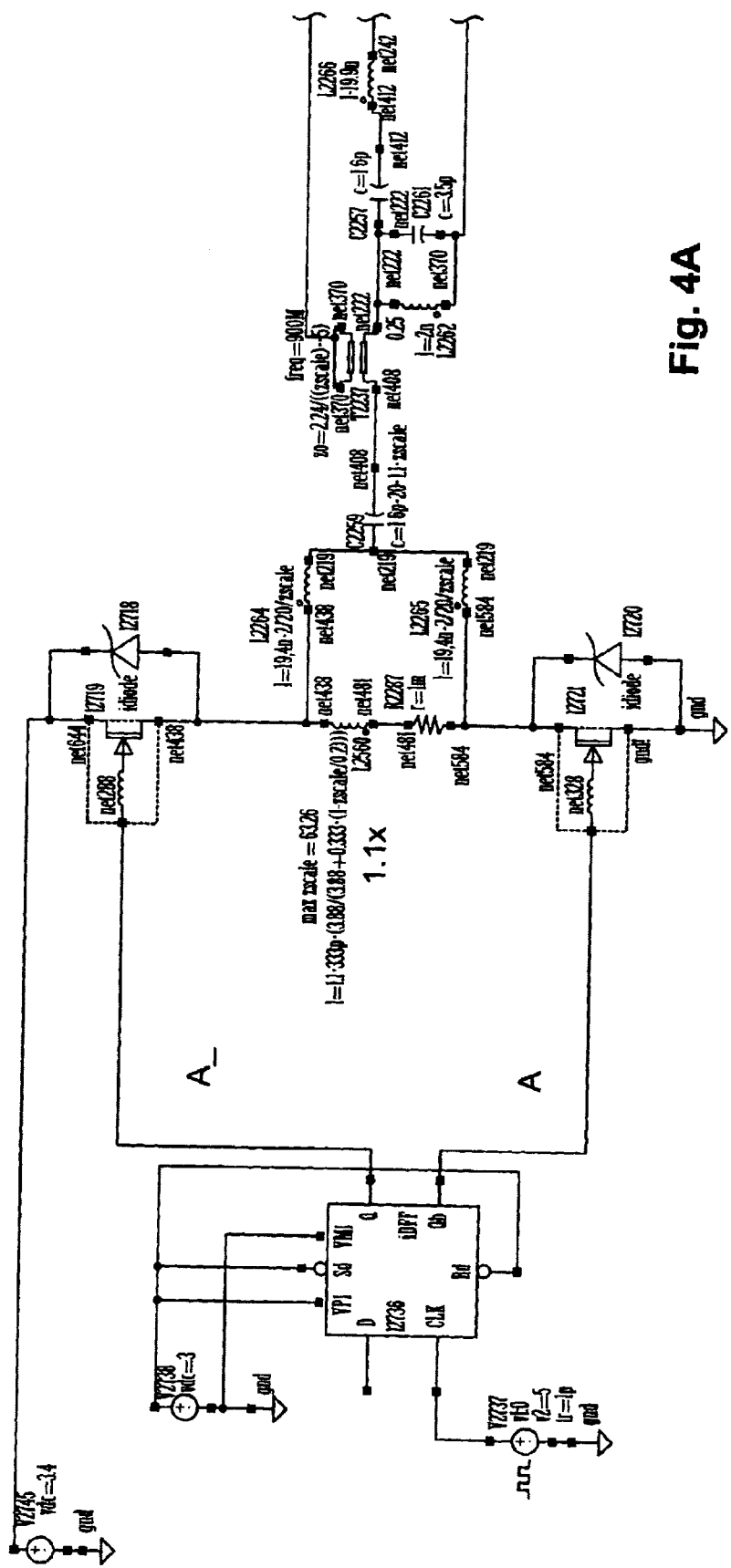
FIG. 4 is a more detailed schematic diagram of an output stage of an RF amplifier designed according to a specific embodiment of the present invention.
Figure 4B:
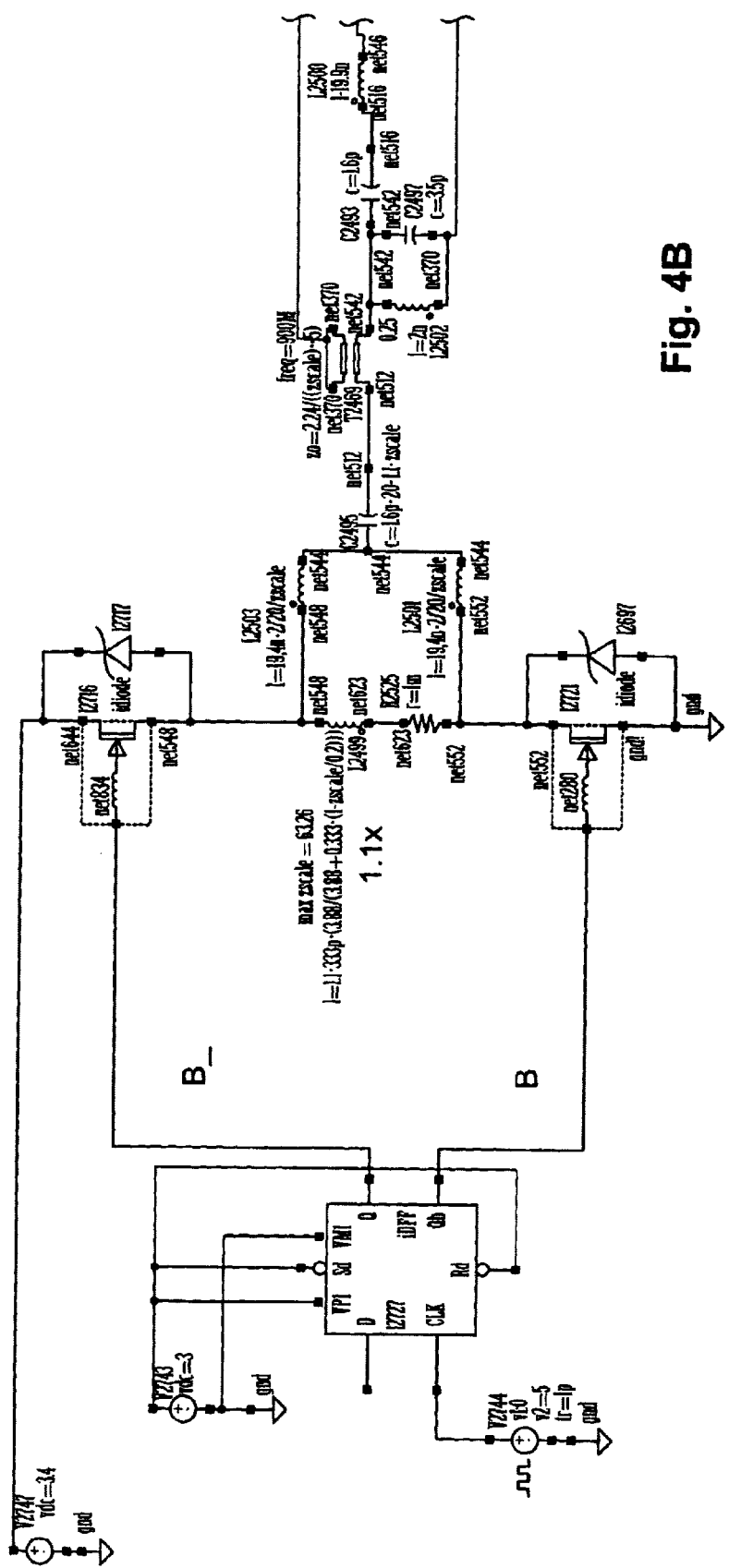
Figure 4C:
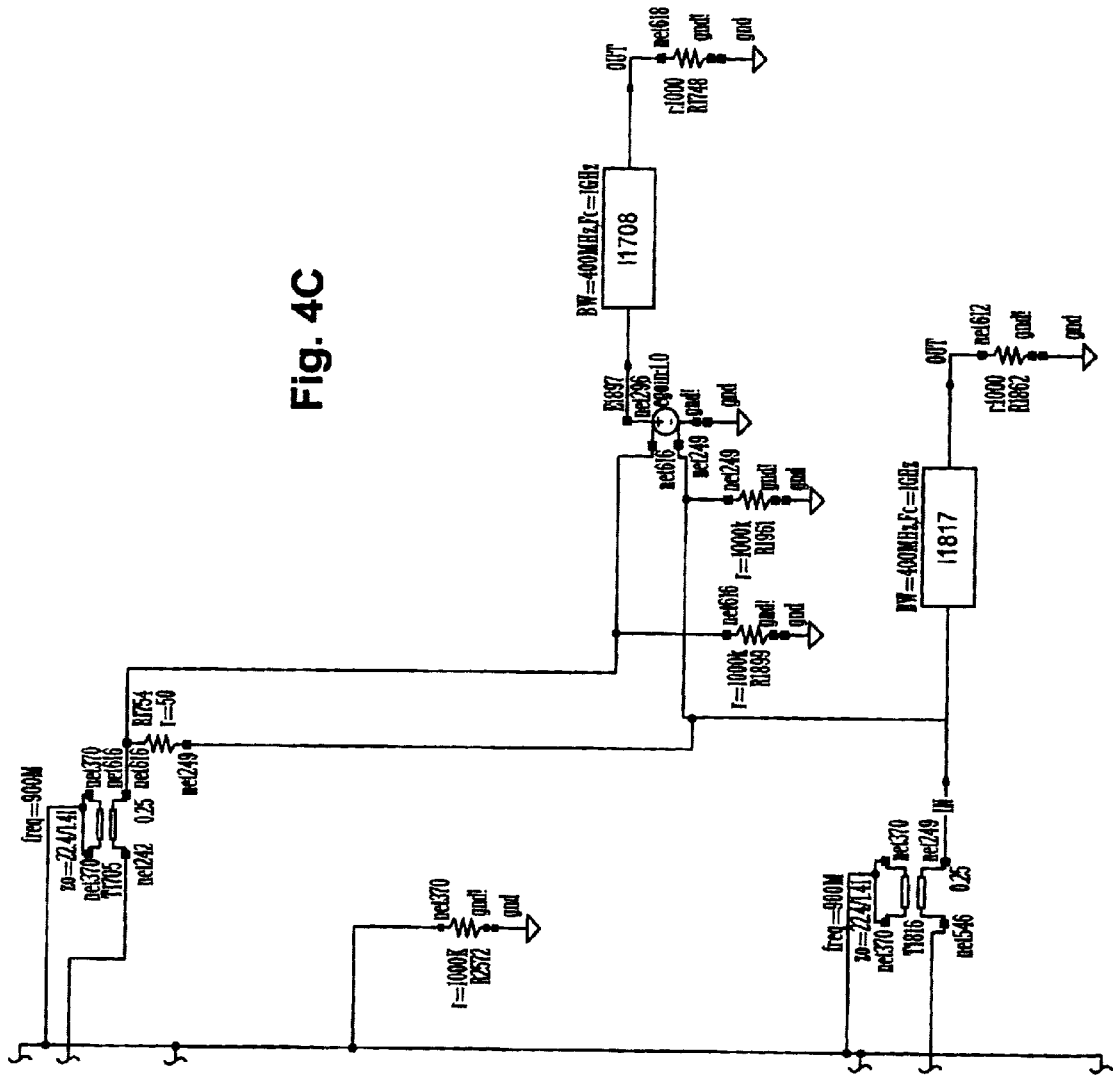

FIG. 4 shows a detailed schematic of a switching stage which, according to a specific embodiment of the present invention, may be employed with the RF amplifier of FIG. 3. It will be understood, however, that the switching stage of FIG. 4 as well as the switching stage of the amplifiers of FIGS. 2 and 3 may be employed in a variety of amplifier types without departing from the scope of the invention. That is, the switching stage configurations of the present invention are suitable for many applications outside of the RF range.

While the present invention has been described in relation to a cell phone application, it should be readily apparent that the invention may be practiced in a wide variety of contexts and alternative embodiments. For example, the RF amplifier of the present invention could be used in a cell base station or any other application requiring an efficient RF amplifier. The digital amplifier of the present invention may also be used for RF transmissions at frequencies such as 1.8 GHz or 3.0 GHz or higher. In such embodiments, higher transmission rates can be achieved by increasing the sampling rate (fs) in accordance with the ratios described above. In addition, the uses of the amplifier configurations and output switching stages are not limited to RF applications. Transistors T1 and T2 can also be a number of different types of devices including MESFETs, HBTs, CMOS, or NMOS and can be fabricated from a number of different processes and materials, including GaAs, SiGe, or standard silicon. It will therefore be understood that the embodiments provided herein are merely exemplary, and that the true scope and spirit of the invention should be determined by the claims.

What is claimed is:

1. A band pass amplifier, comprising:
   a frequency selective network in a feedback loop;
   an analog-to-digital converter coupled to the frequency selective network;
   a switching stage coupled to the analog-to-digital converter for producing a continuous-time output signal, the switching stage comprising at least one resonance circuit configured to resonate at a resonance frequency and thereby generate at least a portion of the continuous-time output signal, the at least one resonance circuit comprising a plurality of inductors configured in a π-network equivalent; and
   a continuous-time feedback path for continuously sensing and feeding back the continuos-time output signal to the frequency selective network.

2. The band pass amplifier of claim 1 wherein the switching stage comprises first and second switches in a half-bridge configuration, each of the first and second switches having parasitic capacitances associated therewith, the switching stage further comprising a plurality of inductors, the at least one resonance circuit comprising two resonance circuits formed from the parasitic capacitances and the inductors, the two resonance circuits being configured to alternately resonate at the resonance frequency.

3. The band pass amplifier of claim 2 wherein each of the two resonance circuits has a resonance node associated therewith which resonates at the resonance frequency.

4. The band pass amplifier of claim 3 wherein the one of the resonance nodes is at a source terminal of the first switch and the other of the resonance nodes is at the drain terminal of the second switch.

5. The band pass amplifier of claim 1 wherein the analog-to-digital converter comprises two comparators configured to implement three-level switching, and wherein the switching stage comprises first and second switches in a first half-bridge configuration, and third and fourth switches in a second half-bridge configuration, each of the first and second half-bridge configurations having two resonance circuits associated therewith which resonate at the resonance frequency.

6. A radio frequency communication system comprising the band pass amplifier of claim 1.

7. The radio frequency communication system of claim 6 wherein the system comprises a handheld cellular communication device.

8. The radio frequency communication system of claim 6 wherein the system comprises a cellular base station transceiver.

9. The band pass amplifier of claim 1 wherein the frequency band of operation is in the radio frequency band.

10. The band pass amplifier of claim 1 wherein the frequency band of operation is centered at 900 MHz.

11. The band pass amplifier of claim 10 wherein the resonance frequency is 1.8 GHz.

12. The band pass amplifier of claim 10 wherein the resonance frequency is 3.6 GHz.

13. The band pass amplifier of claim 1 wherein the frequency band of operation is centered at a first frequency.

14. The band pass amplifier of claim 13 wherein the resonance frequency is two times the first frequency.

15. The band pass amplifier of claim 13 wherein the resonance frequency is four time the first frequency.

16. The band pass amplifier of claim 1 wherein the analog-to-digital converter is a sampling analog-to-digital converter.

17. The band pass amplifier of claim 1 wherein the analog-to-digital converter is an unclocked comparator.

18. A switching stage for a band pass amplifier comprising first and second switches in a half-bridge configuration, each of the first and second switches having parasitic capacitances associated therewith, the switching stage further comprising a plurality of inductors configured in a π-network equivalent, two resonance circuits being formed from the parasitic capacitances and the inductors, the two resonance circuits being configured to alternately resonate at a resonance frequency.

19. The switching stage of claim 18 wherein each of the two resonance circuits has a resonance node associated therewith which resonates at the resonance frequency.

20. The switching stage of claim 19 wherein the one of the resonance nodes is at a source terminal of the first switch and the other of the resonance nodes is at the drain terminal of the second switch.

21. The switching stage of claim 18 wherein the band pass amplifier has a frequency band of operation centered at 900 MHz and wherein the resonance frequency is 1.8 GHz.

22. The switching stage of claim 18 wherein the band pass amplifier has a frequency band of operation centered at 900 MHz and wherein the resonance frequency is 3.6 GHz.

23. The switching stage of claim 18 wherein the band pass amplifier has a frequency band of operation centered at a first frequency and wherein the resonance frequency is two times the first frequency.

24. The switching stage of claim 18 wherein the band pass amplifier has a frequency band of operation centered at a first frequency and wherein the resonance frequency is four time the first frequency.

25. A combined switching stage for a band pass amplifier comprising a high-side switching circuit and a low-side switching circuit, each of the high-side and low-side switching circuits comprising one of the switching stage of claim 18.

26. The combined switching stage of claim 25 wherein the combined switching stage is configured to implement three-level switching.

* * * * *